United States Patent
Kogure et al.

(10) Patent No.: US 6,850,584 B2
(45) Date of Patent: Feb. 1, 2005

(54) CLOCK REGENERATION CIRCUIT AND OPTICAL SIGNAL RECEIVER USING THE SAME

(75) Inventors: Kazuhisa Kogure, Kawasaki (JP); Hiroshi Yamada, Kawasaki (JP); Atsushi Suda, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 723 days.

(21) Appl. No.: 09/729,949

(22) Filed: Dec. 6, 2000

(65) Prior Publication Data

US 2001/0019441 A1 Sep. 6, 2001

(30) Foreign Application Priority Data

Jan. 14, 2000 (JP) ........................................ 2000-005119

(51) Int. Cl.$^7$ ................................................ H03D 3/24
(52) U.S. Cl. ..................... 375/376; 398/155; 327/147
(58) Field of Search ............................... 375/225, 293, 375/294, 354, 373, 375, 376; 398/154, 155; 331/18, 25; 327/147

(56) References Cited

U.S. PATENT DOCUMENTS

| | | | | |
|---|---|---|---|---|
| 5,963,608 A | * | 10/1999 | Casper et al. | 375/373 |
| 6,347,128 B1 | * | 2/2002 | Ransijn | 375/376 |
| 6,498,670 B2 | * | 12/2002 | Yamashita et al. | 398/209 |
| 6,680,970 B1 | * | 1/2004 | Mejia | 375/225 |

FOREIGN PATENT DOCUMENTS

| | | |
|---|---|---|
| JP | 9-284258 | 10/1997 |
| JP | 9-326694 | 12/1997 |
| JP | 10-313277 | 11/1998 |

* cited by examiner

Primary Examiner—Chieh M. Fan
(74) Attorney, Agent, or Firm—Staas & Halsey LLP

(57) ABSTRACT

A clock regeneration circuit having a PLL circuit which includes a voltage control oscillator; a clock extraction circuit which includes a band passing filter and a harmonic component of a dividing signal of the oscillation frequency signal; a frequency detector; a filter; a bit rate detection circuit; and a frequency selection circuit outputting an oscillation frequency of the voltage control oscillator of the PLL circuit or a frequency signal obtained by dividing the oscillation frequency in response to the bit rate detected by the bit rate detection circuit, as a regeneration clock circuit.

11 Claims, 10 Drawing Sheets

Characteristic of the Band Path Filter

VCO Control Voltage Versus Oscillation Frequency Characteristic $f = f_0$ $f = f_0/2$ $f = f_0/3$ $f = f_0/4$

CLOCK REGENERATION CIRCUIT AND OPTICAL SIGNAL RECEIVER USING THE SAME

BACKGROUND OF THE INVENTION

1. Field of the Invention

The present invention relates to a clock regeneration circuit, and in particular to a bit free clock regeneration circuit which enables a clock extraction not depending on a bit frequency, and an optical signal receiver using the same.

2. Description of the Related Arts

In a transmitter, a clock of a reception signal is extracted as a self-synchronous type, and a reception timing of the reception signal is determined in synchronism therewith. For this reason, a clock regeneration circuit for extracting the clock from the reception signal is necessary.

Until now, in a transmission system, generally speaking, a bit rate of the clock in the reception signal is already known, and the clock regeneration circuit at a receiver side was structured corresponding to this fact. A SAW filter is used, or a PLL system is used, and a circuit for extracting and regenerating the clocks of a devotedly signal frequency is used as a clock regeneration circuit.

On the other hand, in recent years, an optical transmission system is spread, and the transmission of a large capacity is further possible due to an optical multiplexing.

FIG. 1 is an example of an optical transmission system, and in a configuration of a transmission side device 20, a multiplexer 200 multiplexes a signal, and an optical transmitter 201 converts it into an optical signal of a single wavelength to transmit it to a reception side device 21 via an optical fiber transmission path 22.

In the reception side device 21, a light receiving element 210 converts the received lights into an electric signal, and a pre-amplifier 211 and a main amplifier 212 amplify it to a predetermined level. Furthermore, the amplified reception signal are sent to a discriminator 214 and a clock regeneration circuit 213.

The clock regeneration circuit 213 extracts a clock signal synchronized with a frequency of the reception signal. At a timing of a clock signal extracted, the discriminator 214 discriminates and outputs the reception signal as data. Furthermore, the clock signal is sent to a multiplexing separation circuit 215 to separate the multiplexing of the reception signal discriminated and output from the discriminator 214.

Here, the optical transmission system in FIG. 1 uses an optical transmission signal of clock frequencies of 155 Mb/s, 622 Mb/s, or 2.4 Gb/s in response to the transmission capacity. Accordingly, it is necessary that the clock regeneration circuit 213 of the optical reception side device 21 prepares the clock regeneration circuits 213 differing respectively corresponding to the clock frequencies for use in the transmission system.

Furthermore, in recent years, in an optical communication, development and practical use of a wavelength division multiplexing communication system are being advanced. The wavelength division multiplexing communication system transmits an optical signal of a large capacity in which frequencies are divided and multiplexed by a WDM (Wavelength Division Multiplexing) system. FIG. 2 is a configurational example of such the wavelength division multiplexing system. An existent system 30 as a transmission side device is a signal source for generating and outputting a plurality of optical signals.

A separate optical signal from the existent system 30 is received, and an optical/electric signal converter 31 converts it into a corresponding electric signal. The optical/electric signal converter 31 converts into an electric signal, and after a predetermined signal processing is effected, an electric/optical signal converter 32 again converts it into an optical signal.

The plurality of optical signals from the electric/optical signal converter 32 are converted into an optical signal of a wavelength corresponding to each signal by an optical multiplexer 33, which transmits it to an optical transmission path 34 as a wavelength division multiplexing signal.

A wavelength division multiple optical signal propagates through the optical transmission path 34, and is input to an optical multiplexing separator 35 of the reception side device. The wavelength division multiplexing optical signal is separated to a separate optical signal in each wavelength, and is converted into an electric signal by a corresponding optical/electric signal converter 36.

As occasion demands, an electric/optical signal converter 37 again converts into an optical signal, and an existent system 38 converts it into an electric signal, and a separate optical signal is processed in each wavelength.

Accordingly, in a system example of FIG. 2, in the existent system, the clock regeneration circuit corresponding to each wavelength is necessary.

SUMMARY OF THE INVENTION

In light of problems in the conventional system, it is an object of the present invention to extract a clock in a common circuit with a plurality of clock signals.

it is another object of the present invention to provide a bit free clock regeneration circuit capable of extracting clocks of different bit rates of the wavelength division multiplexing optical reception signal with a type of circuit configuration when being used as an optical receiver, and an optical signal receiver using the same.

As for a basic concept in the clock regeneration circuit which solves problems in the present invention, the clock regeneration circuit comprises a clock extraction circuit having a band pass filter having a wide range of passing frequencies, and an oscillation frequency of a voltage control oscillation in a PLL circuit agrees with basic waves or harmonic waves of a signal. Thereafter, a phase with the signal is controlled at a discrimination optimal point. Next, the bit rate of data of an output signal is detected, and the clock in synchronism with the signal is regenerated. Thereby, the bit free clock regenerator and the optical signal receiver using the same are realized.

In order to solve the above problems, according to an aspect of the present invention there is provided a clock regeneration circuit, comprising a PLL circuit which comprises a voltage control oscillator, and synchronizes an oscillation frequency signal of the voltage control oscillator with a phase of a reception signal; a clock extraction circuit which comprises a band passing filter having a passing band width which concurrently extracts a basic waves component of the oscillation frequency signal of the voltage control oscillator and a harmonic component of a dividing signal of the oscillation frequency signal, and extracts a clock component of the reception signal; a frequency detector for detecting a different in frequencies between an output of the clock extraction circuit and an oscillation frequency of the voltage control oscillator; a filter for controlling the oscillation frequency of the voltage control oscillator of the PLL circuit at a detection output of the frequency detector; a bit rate detection circuit for detecting a bit rate of the reception signal; and a frequency selection circuit for outputting an oscillation frequency of the voltage control oscillator of the PLL circuit or a frequency signal obtained by dividing the oscillation frequency in response to the bit rate detected by the bit rate detection circuit, as a regeneration clock signal.

Preferably, the clock extraction circuit further comprises a delay circuit for delaying the reception signal by the half cycle; and an EX-OR circuit for acquiring an exclusive OR operation of an output of the delay circuit and the reception signal, wherein the output of the EX-OR circuit is led to the band passing filter in the configuration.

Preferably, the bit rate detection circuit comprises a first AND gate for taking a conjunction of the reception signal and the oscillation frequency signal of the voltage control oscillator of the PLL circuit; a delay circuit for delaying an output of the first AND gate by 1 cycle of the oscillation frequency signal of the voltage control oscillator; a second AND gate for taking a conjunction of an output of the first AND gate and an output of the delay circuit; and a circuit for acquiring an average value of the output of the AND gate.

Preferably, the bit rate detection circuit comprises an AND gate for synthesizing the reception signal with a signal obtained by inverting the reception signal; and a circuit for acquiring an average value of the output of the AND gate.

Preferably, the bit rate detection circuit comprises an AND gate for synthesizing the reception signal with a signal obtained by inverting the reception signal; and a circuit for counting a change point of the output of the AND gate.

The above and other objects, aspects, features and advantages of the present invention will become more apparent from the following description of the preferred embodiments when read in conjunction with the accompanying drawings.

DESCRIPTION OF THE PREFERRED EMBODIMENTS

Figure 1:
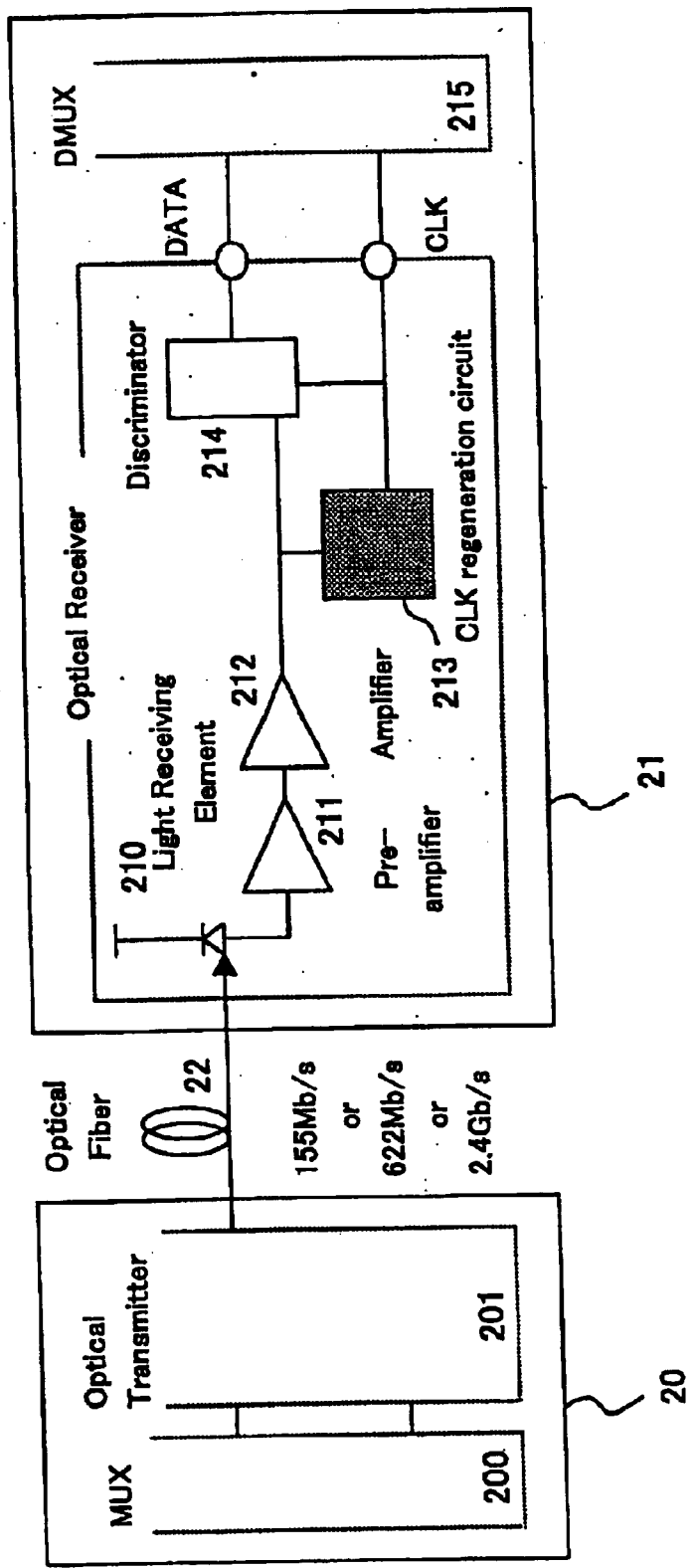
FIG. 1 is a block diagram of a configurational example showing one example of an optical transmission system.
Figure 2:
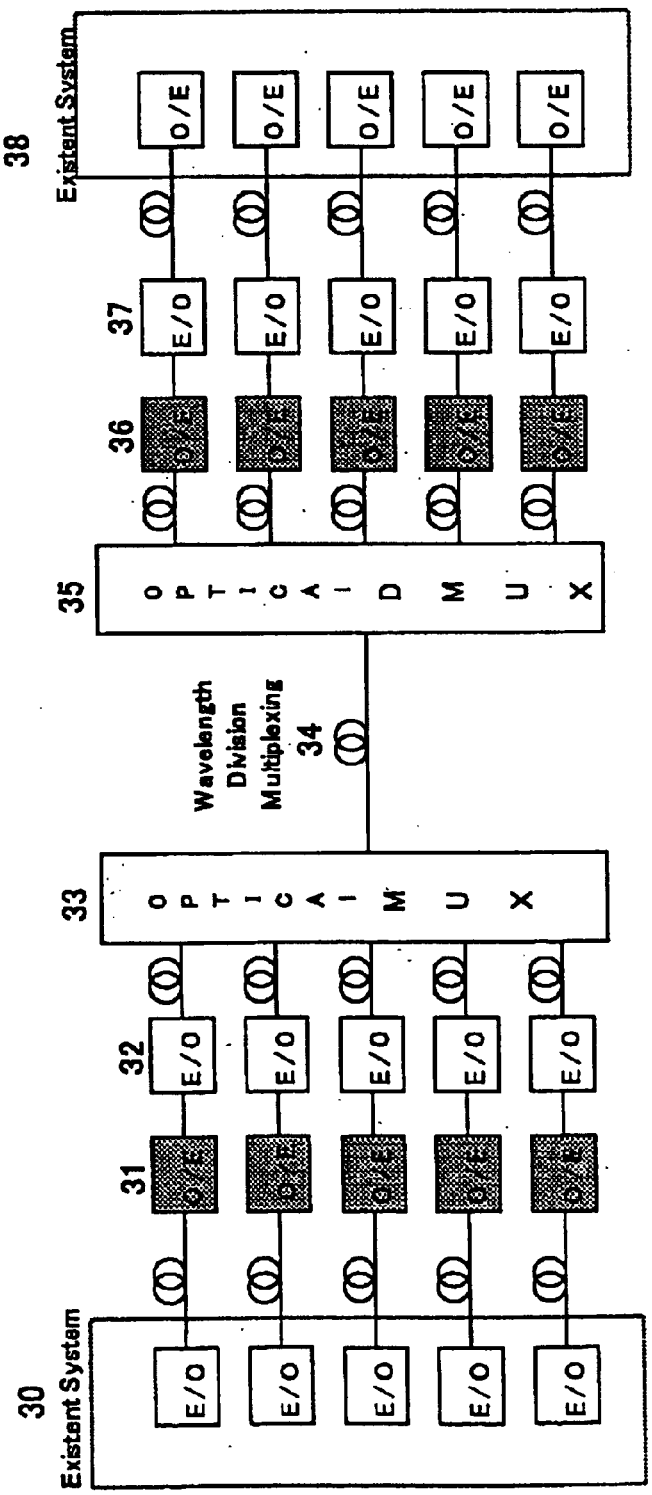
FIG. 2 is a block diagram with a configurational example of a wavelength division multiplexing system.

An embodiment of the present invention will now be described with reference to the drawings. Incidentally, the same reference numerals or reference symbols are assigned to the same or similar components in the drawings for explanation.

Figure 3:
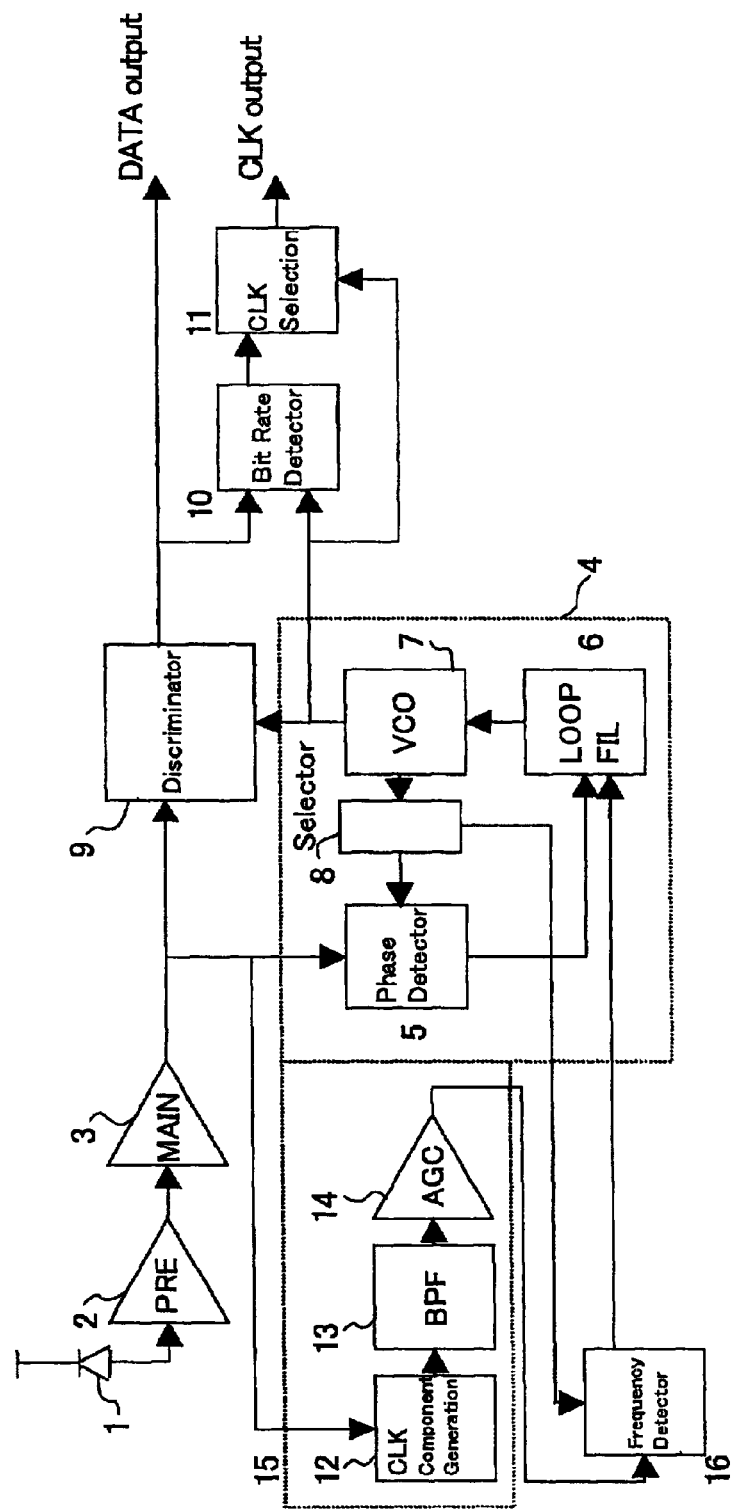
FIG. 3 is a diagram showing an embodiment configuration of a clock extraction circuit according to the present invention, applied to an optical receiver.

FIG. 3 is a diagram showing a configuration of a clock regeneration circuit according to the embodiment of the present invention which is applicable to an optical receiver. In FIG. 3, a received optical signal is converted into an electric signal by a light reception element 1. The received optical signal which is converted into the electric signal is amplified up to a discriminable level through a pre-amplifier 2 and a main amplifier 3.

An output of the main amplifier 3 is input to a clock extraction circuit 15 and a PLL circuit 4 configuring the clock regeneration circuit having characteristics according to the present invention.

In a clock component generation circuit 12 of the clock extraction circuit 15, a clock component is output from the input reception signal. Next, in a band pass filter 13 as a clock extraction function part having a wide band width, the clock frequency component is extracted.

An output of the band pass filter 13 is amplified by an AGC amplifier 14 and is input to a frequency detector 16.

The frequency detector 16 compares a clock frequency from the AGC amplifier 14 with an output frequency of a voltage control oscillator 7 of the PLL circuit 4 which is input through a selection circuit 8.

At a point of time when agreed in frequency comparison, an output direction of the selector 8 is switched, and a phase detector 5 phase-compares a reception signal from a main amplifier 3 with an output of the voltage control oscillator 7.

Figure 4A:
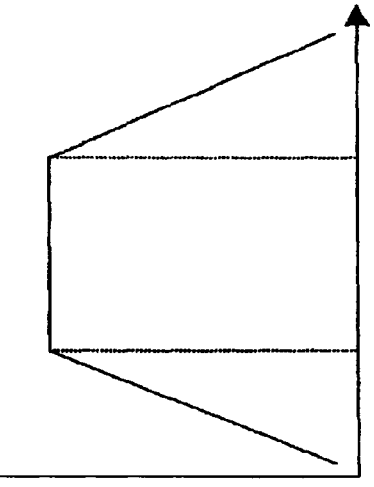
FIG. 4 is a diagram for explaining a band width of a band pass filter 1 and a control range of a voltage control oscillator 7.
Figure 4B:
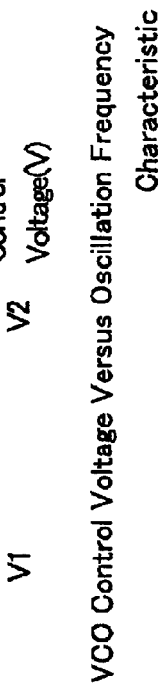

Here, a band width of the band pass filter 3 agrees with a control range of the voltage control oscillator 7 as in FIG. 4. Namely, FIG. 4A is a passing band characteristic of the band pass filter 13, having a passing band width 1.35 GHz to 2.7 GHz as the embodiment. On the other hand, FIG. 4B is a diagram showing a control voltage versus oscillation frequency characteristic of the voltage control oscillator 7.

As shown in FIG. 4B, the voltage control oscillator 7 outputs a frequency signal of 1.35 GHz to 2.7 GHz so as to correspond to the passing band width of the band pass filter 13 in the range of the control voltages V1 to V2. By such the setting, a capture range is widened.

For example, as shown in FIG. 4, in the case where the frequency ranges of the band pass filter 13 and voltage control oscillator 7 are set to be 1.35 GHz to 2.7 GHz, and an input signal is set as 155 Mb/s, the clock components of 2.4 GHz as harmonic components of the input signal of 155 Mb/s are output from the band pass filter 13.

Until these clock components agree with the output frequencies of the voltage control oscillator 7 by the frequency detector 16, the voltage control oscillator 7 is controlled in a voltage through a loop filter 6.

In this manner, in the present invention, it is possible to receive a bit rate of 1 over an integer in the range of the frequencies, and to realize a bit rate free.

Next, the oscillation frequency of the voltage control oscillator 7 is input to a discriminator 9, and also is input to a bit rate detector 10. The discriminator 9 detects a level of a reception signal at an oscillation frequency timing of the voltage control oscillator 7, and outputs it as reception data.

Incidentally, 155 Mb/s was available as the above embodiment, but the present invention is not limited thereto. Namely, the present invention is applicable to 155 Mb/s, 600 Mb/s, and 2.4 Gb/s as the existent bit rates, and additionally is applicable to a bit rate other than these existent bit rates, for example 125 Mb/s, too.

A bit rate detector 10 inputs output data of the discriminator 9, and detects the bit rate of these data at an oscillation frequency timing of the voltage control oscillator 7. A clock selection circuit 11 selects a clock agreeing with the bit rate to output it.

Incidentally, as a method for detecting the bit rate in the bit rate detector 10, as explained in detail below, there are a method for converting the data into a RZ signal and a method for detecting an edge of the data.

Figure 5:
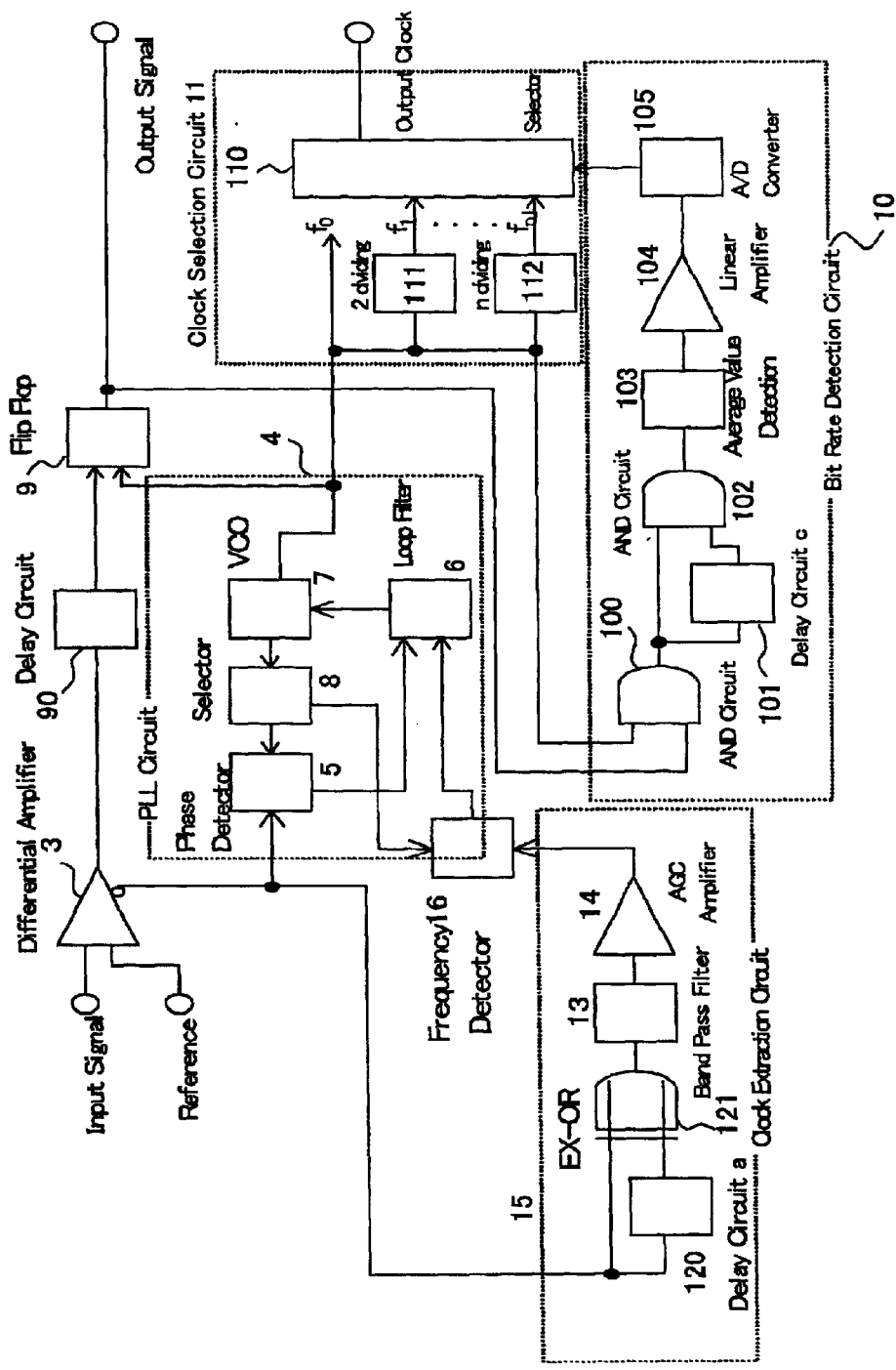
FIG. 5 is a detailed circuit example in the block diagram of the embodiment of FIG. 3.

FIG. 5 is an example of a detailed circuit in the block diagram according to the embodiment of FIG. 3.

Figure 6:
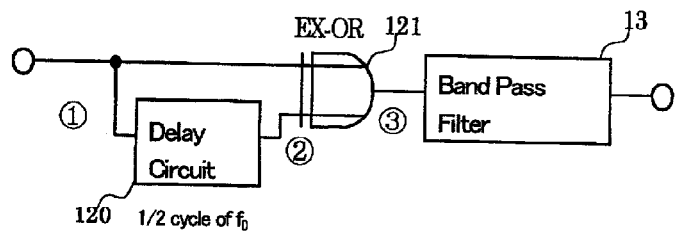
FIG. 6 is a block diagram showing a configuration of a main part of a clock extraction circuit 15.

A discrimination circuit 9 is constituted by a flip-flop, and a clock component generation circuit of the clock extraction circuit 15 is configured by a delay circuit 120 and an exclusive OR operation (EX-OR) circuit 121, as shown in FIG. 6. An output of the exclusive OR operation (EX-OR) circuit 121 is input to the band pass filter 13.

Figure 7:
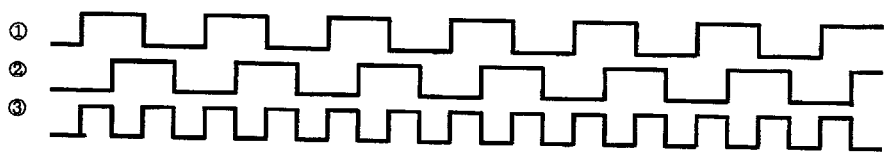
FIG. 7 is an operational waveform diagram in each part of FIG. 6.
Figure 7:
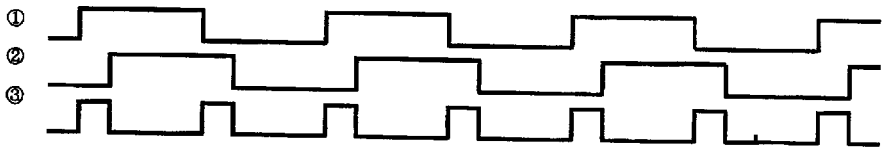
Figure 7:
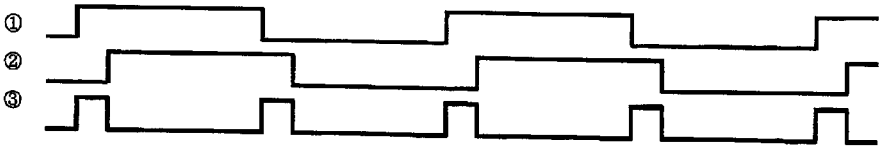
Figure 7:
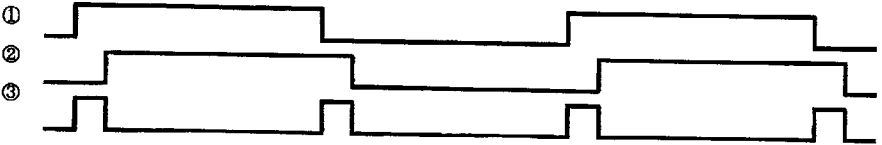

This clock extraction circuit 15 utilizes $f_0$ components of the input signal, and in the circuit shown in FIG. 6, in the case where the input signals are an alternative of "1" and "0", for clarity of the description, output waveforms in each part in FIG. 6 are shown in ① to ③ of FIG. 7.

Assume that the input waveforms are basically rectangular waves, the output ③ of the exclusive OR operation (EX-OR) circuit 121 becomes a cyclic pulse as shown in formula 1.

$$v(t) = \frac{t_0}{T} \sum_{n=1}^{\infty} \frac{2}{n\pi} \sin\frac{n\pi}{T} t \cdot \cos n\omega t \qquad 1$$

Accordingly, respective frequency spectra of the basic waves $f_0$ and 1 over an integer of the basic waves $f_0$ are as follows:

$f = f_0$ $v1(t) = a_0 + a_1 \cos 2\pi f_0 + a_2 \cos 4\pi f_0 + a_3 \cos 6\pi f_0 + \ldots + a_n \cos 2n\pi f_0$ $$a_0 = \frac{t_0}{T_0} = 1/2, \quad a_n = \frac{2}{n\pi}\sin\frac{n\pi}{T_0}t_0 = \frac{2}{n\pi}\sin\frac{n\pi}{2}$$

$f = f_0/2$ $v2(t) = a_0 + a_1 \cos 2\pi f_0/2 + a_2 \cos 4\pi f_0/2 + a_3 \cos 6\pi f_0/2 + \ldots + a_n \cos 2n\pi f_0/2$ $= a_0 + a_1 \cos \pi f_0 + a_2 \cos 2\pi f_0 + a_3 \cos 3\pi f_0 + \ldots + a_n \cos n\pi f_0$ $$a_0 = \frac{t_0}{T_0} = 1/4, \quad a_n = \frac{2}{n\pi}\sin\frac{n\pi}{T_0}t_0 = \frac{2}{n\pi}\sin\frac{n\pi}{4}$$

$f = f_0/3$ $v3(t) = a_0 + a_1 \cos 2/3\pi f_0 + a_2 \cos 4/3\pi f_0 + a_3 \cos 2\pi f_0 + \ldots + a_n \cos n/3\pi f_0$ $$a_0 = \frac{t_0}{T_0} = 1/6, \quad a_n = \frac{2}{n\pi}\sin\frac{n\pi}{T_0}t_0 = \frac{2}{n\pi}\sin\frac{n\pi}{6}$$

$f = f_0/4$ $v4(t) = a_0 + a_1 \cos 1/2\pi f_0 + a_2 \cos \pi f_0 + a_3 \cos 3/2\pi f_0 + a_4 \cos 2\pi f_0 + \ldots + a_n \cos n/4\pi f_0$ $$a_0 = \frac{t_0}{T_0} = 1/8, \quad a_n = \frac{2}{n\pi}\sin\frac{n\pi}{T_0}t_0 = \frac{2}{n\pi}\sin\frac{n\pi}{8}$$

Figure 8:
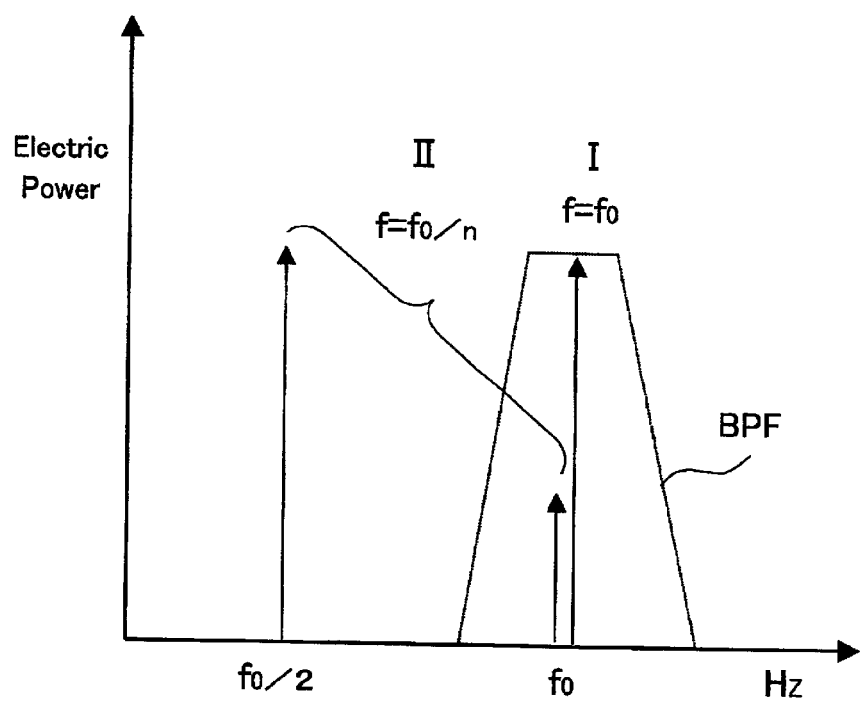
FIG. 8 is a diagram showing a passing band of a band pass filter 13 of FIGS. 5 and 6.

Here, when a passing band BPF of the band pass filter 13 of FIGS. 5 and 6 has a wide band width as shown in FIG. 8, both in the case of $f = f_0$ and in the case of $f = f_0/n$, only a term of $2\pi f_0$ of the above formula is selected to be output as a clock $f_0$.

That is, in the case of $f = f_0$, basic waves (the second term), and in the case of $f = f_0/2$, secondary harmonic waves (the third term), and in the case of $f = f_0/3$, tertiary harmonic waves (the fourth term), and in the case of $f = f_0/4$, quartic harmonic waves (the fifth term), spectrum components thereof agree with each other within the passing band width BPF of the band pass filter 13 to be output.

Thus, even at any bit rate speed, harmonic components of the frequencies set by the band pass filter 13 exist.

The AGC amplifier 14 amplifies an amplitude of these harmonic components up to a constant amplitude, and as described previously, it is compared with the oscillation frequency of the voltage control oscillator 7.

Figure 9:
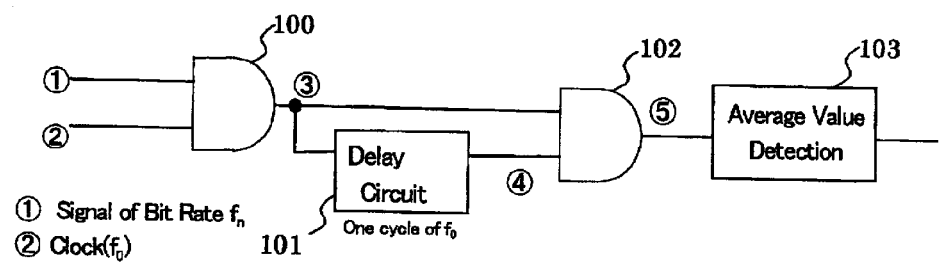
FIG. 9 is a block diagram showing a configuration of a main part of a bit rate detection circuit 10.

Furthermore, in FIG. 5, in the bit rate detection circuit 10, as one example, the main part is constituted so as to have a first AND gate 100, a second AND gate 102, a delay circuit 101, and an average value detection circuit 103, as shown in FIG. 9.

This embodiment is constituted so as to realize a method for converting the data into a RZ signal to detect.

Figure 10:
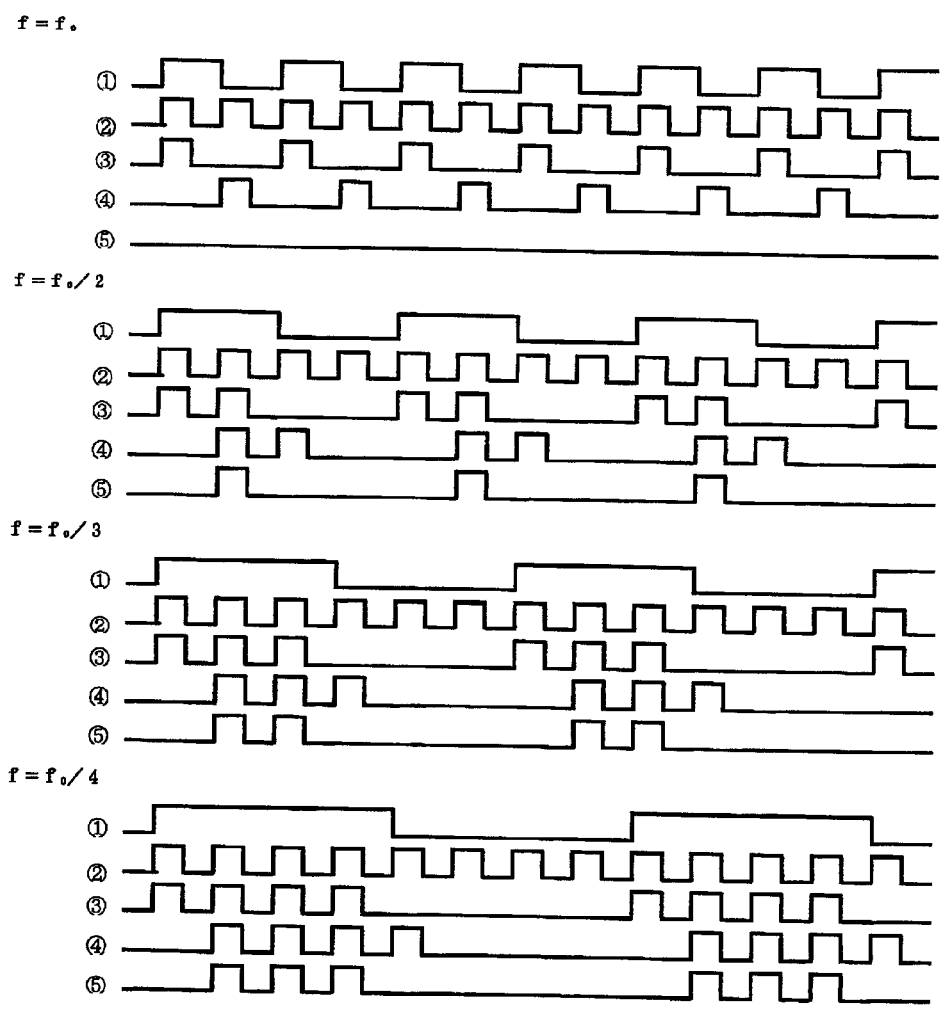
FIG. 10 is a waveform view in response to respective parts ① to ③ of FIG. 9.

FIG. 10 is a waveform view in response to respective parts ① to ③ of FIG. 9. For example, the input signal (NRZ signal) ① is converted into the RZ signal according to a clock ($f_0$) ② by the first AND gate 100 (③), and it is further delayed by 1 cycle of $f_0$ by the delay circuit 101 (④), and a conjunction ⑤ with ④ is output from the second AND gate 102.

Next, in an output from the AND gate 102, an average value is output at an appropriate time constant by the average value detection circuit 103, whereby a voltage output in response to the bit rate to be detected is possible.

Namely, in the example shown in FIG. 10, in the case where the bit rate is $f = f_0/4$, a larger average value output than the other rates is obtained. In FIG. 5, an output of this average value detection circuit 103 is amplified by a linear amplifier 104 located at a latter part of the bit rate detection circuit 10, and is converted into a corresponding digital signal by an A/D converter 105.

In FIG. 5, the clock selection circuit 11 is further constituted so as to have a plurality of dividing circuits 111, 112 and a selector 110. The basic frequency $f_0$ and first to n-th dividing signals $f_1$ to $f_n$ are input to the selector 110. Accordingly, the selector 110 selects and outputs a specified dividing signal by a digital signal output from the A/D converter 105.

Figure 11:
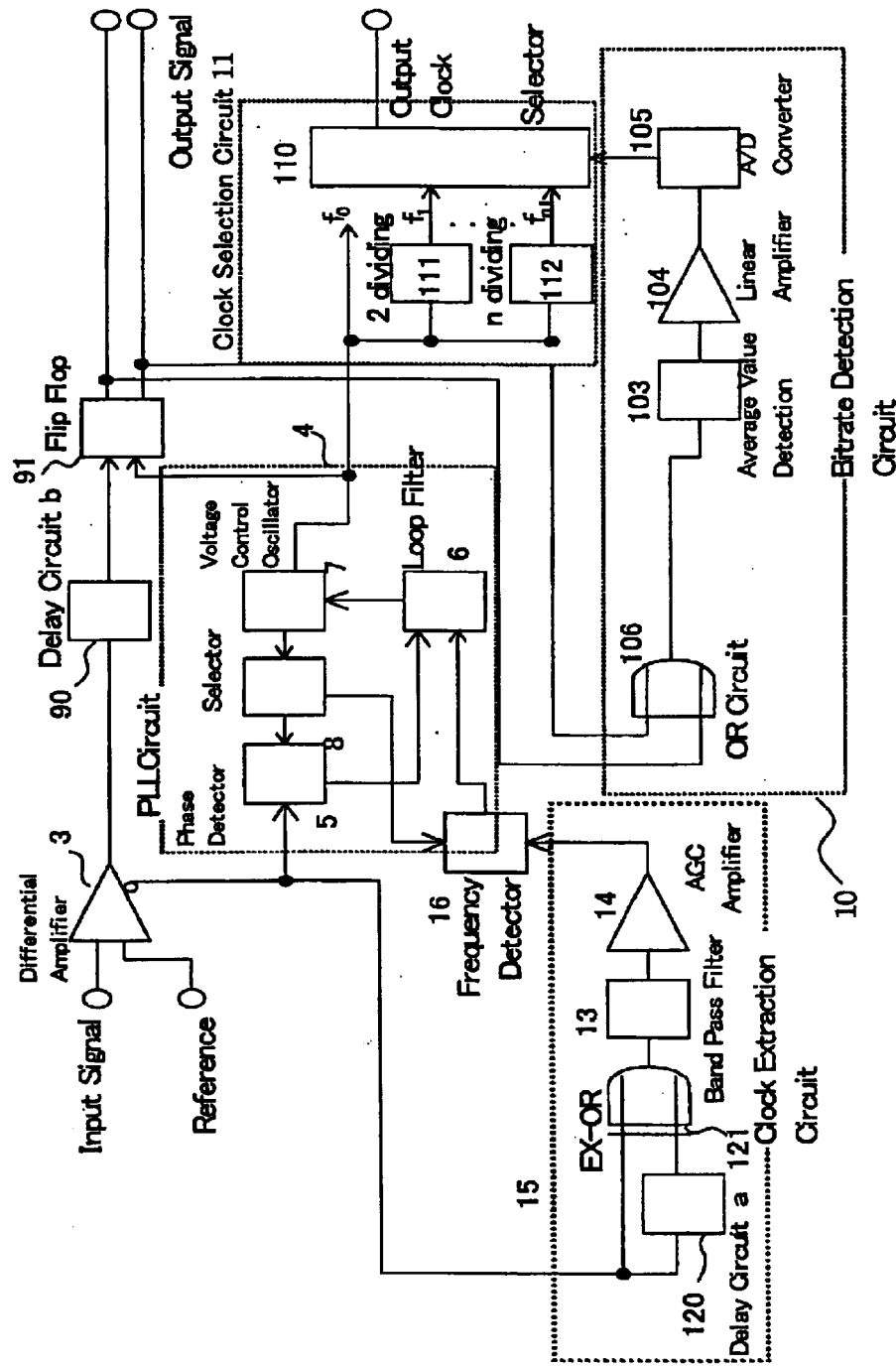
FIG. 11 is a second detailed circuit example in the lock diagram of the embodiment of FIG. 3.

FIG. 11 is a configurational example of an optical receiver to which a configuration of the bit rate detection circuit 10 is applied in the case where the configuration of the bit rate detection circuit 10 is detected utilizing an edge of data. Accordingly, the configurational example of the optical receiver of FIG. 5 differs from only the configuration of the bit rate detection circuit 10.

Figure 12:
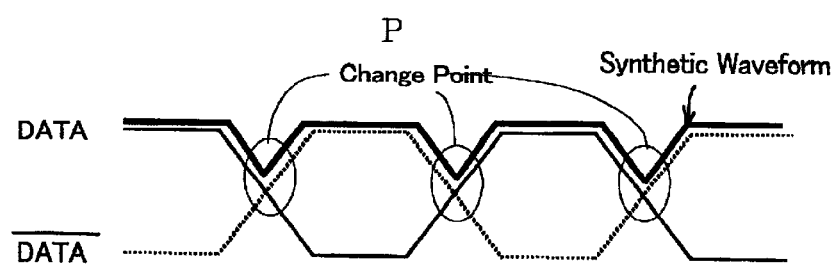
FIG. 12 is a diagram for explaining the case where a bit rate is detected utilizing an edge of data in the configuration of FIG. 11.

This embodiment utilizes a fact that actual input waveforms have a fixed inclination at a change point of a signal. FIG. 12 is a diagram for explaining this. In FIG. 12, data (DATA) and results reversing the data (/DATA) are synthesized with each other. The embodiment of FIG. 11 is constituted so that an OR output of the data (DATA) and results reversing the data (/DATA) is obtained by an OR gate 106.

In this synthetic output, an average value is detected at an appropriate time constant by the average detection circuit 103, thereby detecting a bit rate. Alternatively, the change points P of the synthetic waveforms shown in FIG. 12 are counted, so that the bit rate can be detected, too.

Furthermore, even in the embodiment shown in FIG. 11, as handlings of the output on of the average value detection circuit 103 are same with the embodiment of FIG. 5, the description is omitted.

As set forth hereinabove based on the drawings, according to the present invention, even if a signal of any bit rate is input, a regeneration of the clock signal can reliably be effected.

Therefore, it is possible to constitute a bit free network by making use of a transmission path or repeater of the existent bit rate, and flexibility of the system configuration is increased to a large extent.

It will be appreciated that the above description of the embodiments is only for the understanding of the present invention and that the scope of protection of the present invention is not limited thereto. Furthermore, the claims and its equivalents are to be construed as lying within the scope of protection of the present invention.

What is claimed is:

1. A clock regeneration circuit, comprising:
   a PLL circuit which includes a voltage control oscillator, for synchronizing an oscillation frequency signal of the voltage control oscillator with a phase of a reception signal;
   a clock extraction circuit which includes a band passing filter having a passing band width which concurrently extracts a basic waves component of the oscillation frequency signal of the voltage control oscillator and a harmonic component of a dividing signal of the oscillation frequency signal, for extracting a clock component of the reception signal;
   a frequency detector for detecting a difference in frequencies between an output of the clock extraction circuit and an oscillation frequency of the voltage control oscillator;
   a filter for controlling the oscillation frequency of the voltage control oscillator of the PLL circuit at a detection output of the frequency detector;
   a bit rate detection circuit for detecting a bit rate of the reception signal; and
   a frequency selection circuit for outputting the oscillation frequency of the voltage control oscillator of the PLL circuit or a frequency signal obtained by dividing the oscillation frequency in response to the bit rate detected by the bit rate detection circuit, as a regeneration clock signal.

2. The clock regeneration circuit according to claim 1, wherein
   the clock extraction circuit further includes:
   a delay circuit for delaying the reception signal by a half cycle of the reception signal; and
   an EX-OR circuit for acquiring an exclusive OR operation of an output of the delay circuit and the reception signal, wherein
   the output of the EX-OR circuit is coupled to the band passing filter.

3. The clock regeneration circuit according to claim 1, wherein
   the bit rate detection circuit includes:
   a first AND gate for taking a conjunction of the reception signal and the oscillation frequency signal of the voltage control oscillator of the PLL circuit;
   a delay circuit for delaying an output of the first AND gate by 1 cycle of the oscillation frequency signal of the voltage control oscillator;
   a second AND gate for taking a conjunction of an output of the first AND gate and an output of the delay circuit; and
   a circuit for acquiring an average value of the output of the second AND gate.

4. The clock regeneration circuit according to claim 1, wherein
   the bit rate detection circuit includes:
   an OR gate for synthesizing the reception signal with a signal obtained by inverting the reception signal; and
   a circuit for acquiring an average value of the output of the OR gate.

5. The clock regeneration circuit according to claim 1, wherein
   the bit rate detection circuit includes:
   an OR gate for synthesizing the reception signal with a signal obtained by inverting the reception signal; and
   a circuit for counting a change point of the output of the OR gate.

6. An optical signal receiver, comprising:
   a light receiving element for converting a received light signal into a reception electric signal;
   a PLL circuit which includes a voltage control oscillator, for synchronizing an oscillation frequency signal of the voltage control oscillator with a phase of the reception electric signal;
   a clock extraction circuit which includes a band passing filter having a passing band width which concurrently extracts a basic waves component of the oscillation frequency signal of the voltage control oscillator and a harmonic component of a dividing signal of the oscillation frequency signal, for extracting a clock component of the reception electric signal;
   a frequency detector for detecting a difference in frequencies between an output of the clock extraction circuit and an oscillation frequency of the voltage control oscillator;
   a loop filter for controlling the oscillation frequency of the voltage control oscillator of the PLL circuit by a detection output of the frequency detector;
   a discriminator for discriminating a level of the reception electric signal at a frequency timing of the output of the PLL circuit to output discrimination data;
   a bit rate detection circuit for detecting a bit rate of the reception electric signal; and
   a frequency selection circuit for outputting the oscillation frequency of the voltage control oscillator of the PLL circuit or a frequency signal obtained by dividing the oscillation frequency in response to the bit rate detected by the bit rate detection circuit, as a regeneration clock signal.

7. A clock regeneration circuit, comprising:
   a PLL circuit including a voltage control oscillator, synchronizing an oscillation frequency signal of the voltage control oscillator with a phase of a reception signal;
   a clock extraction circuit including a band passing filter having a passing band width which concurrently extracts basic wave components of the oscillation frequency signal of the voltage control oscillator and a harmonic component of a dividing signal of the oscillation frequency signal, for extracting a clock component of the reception signal; and a frequency selection circuit outputting the oscillation frequency signal of the voltage control oscillator of the PLL circuit or a frequency signal obtained by dividing the oscillation frequency in response to a bit rate of the reception signal, as a regeneration clock signal.

8. The clock regeneration circuit of claim 7, further comprising:

a bit rate detection circuit detecting the bit rate of the reception signal.

9. The clock regeneration circuit of claim 8, wherein the bit rate detection circuit includes:

a first AND gate for taking a conjunction of the reception signal and the oscillation frequency signal of the voltage control oscillator of the PLL circuit;

a delay circuit for delaying an output of the first AND gate by 1 cycle of the oscillation frequency signal of the voltage control oscillator;

a second AND gate for taking a conjunction of an output of the first AND gate and an output of the delay circuit; and a circuit for acquiring an average value of the output of the second AND gate.

10. The clock regeneration circuit of claim 8, wherein the bit rate detection circuit includes:

an OR gate for synthesizing the reception signal with a signal obtained by inverting the reception signal; and a circuit for acquiring an average value of the output of the OR gate.

11. The clock regeneration circuit according to claim 7, wherein the clock extraction circuit further includes:

a delay circuit for delaying the reception signal by a half cycle of the reception signal; and an EX-OR circuit for acquiring an exclusive OR operation of an output of the delay circuit and the reception signal; wherein the output of the EX-OR circuit is coupled to the band passing filter.

* * * * *

UNITED STATES PATENT AND TRADEMARK OFFICE
CERTIFICATE OF CORRECTION

PATENT NO. : 6,850,584 B2
DATED : February 1, 2005
INVENTOR(S) : Kazuhisa Kogure et al.

It is certified that error appears in the above-identified patent and that said Letters Patent is hereby corrected as shown below:

Column 10,
Line 16, change ";" to -- , --.

Signed and Sealed this

Twelfth Day of July, 2005

JON W. DUDAS
*Director of the United States Patent and Trademark Office*